United States Patent
Sinha et al.

(10) Patent No.: US 6,847,569 B2
(45) Date of Patent: Jan. 25, 2005

(54) DIFFERENTIAL CURRENT SENSE AMPLIFIER

(75) Inventors: Manoj K. Sinha, Boise, ID (US); Ram Krishnamurthy, Portland, OR (US); Atila Alvandpour, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/330,557

(22) Filed: Dec. 30, 2002

(65) Prior Publication Data

US 2004/0125678 A1 Jul. 1, 2004

(51) Int. Cl.[7] ............................................. G11C 7/02
(52) U.S. Cl. ...................... 365/207; 365/205; 365/188
(58) Field of Search ................................ 365/207, 205, 365/188

(56) References Cited

U.S. PATENT DOCUMENTS

| | | | | |
|---|---|---|---|---|
| 4,825,110 A | * | 4/1989 | Yamaguchi et al. | 330/253 |
| 5,293,349 A | * | 3/1994 | Hollander et al. | 365/230.05 |
| 5,982,693 A | * | 11/1999 | Nguyen | 365/208 |
| 6,181,618 B1 | * | 1/2001 | Inaba et al. | 365/207 |
| 6,198,677 B1 | * | 3/2001 | Hsu et al. | 365/207 |
| 6,281,713 B1 | * | 8/2001 | Kim | 327/55 |
| 6,285,580 B1 | * | 9/2001 | Phan et al. | 365/156 |
| 6,396,329 B1 | * | 5/2002 | Zerbe | 327/336 |

* cited by examiner

*Primary Examiner*—Richard Elms
*Assistant Examiner*—Tuan T. Nguyen
(74) *Attorney, Agent, or Firm*—Fleshner & Kim, LLP

(57) ABSTRACT

A high-performance, low energy amplifier circuit for the detection and amplification of a voltage differential includes a current conveyor and a sense amplifier. The current conveyor includes a pair of cross-linked transistors and a pair of pass transistors. The sense amplifier includes four transistors forming a cross-linked current sense amplifier. The current sense amplifier detects a current differential between complementary bit lines, develops a differential voltage based on the current differential, amplifies the differential voltage and outputs the amplified differential voltage.

31 Claims, 5 Drawing Sheets

DIFFERENTIAL CURRENT SENSE AMPLIFIER

BACKGROUND OF THE INVENTION

1. Field of the Invention

The present invention relates to semiconductor devices. In particular, the present invention relates to a differential current sense amplifier for semiconductor memory caches.

2. Background of the Related Art

Semiconductor memory devices are used in a wide variety of products and applications to store data. Conventional semiconductor memory devices use voltage sense amplifiers to sense or detect stored data from a selected memory cell. FIG. 1 shows a typical use of a voltage sense amplifier in a memory device. The memory cell being read produces a current ($I_D$) that removes some of the charge (dQ) stored on the pre-charged bit-lines. Since the bit-lines are long and shared by other memory cells, the parasitic resistance ($R_{BL}$) and capacitance ($C_{BL}$) are very large. Therefore, the resulting bit-line voltage swing ($dV_{BL}$) caused by the removal of the charge (dQ) from the bit-line is very small ($dV_{BL}=dQ/C_{BL}$). Voltage sense amplifiers amplify this small voltage to a more useful full logic signal that can be used by the logic circuit that requires signals to be above a threshold voltage.

One example of a voltage sense amplifier is shown in FIG. 2. The voltage sense amplifier includes a bistable element embodied by a pair of cross-coupled P-channel devices and a pair of cross-coupled N-channel devices. The sources of the P-channel devices are connected to a positive power supply with respect to ground. The sources of the N-channel devices are tied to a positive power supply through another P-channel device and a ground through another N-channel device, and driven by sense amplifier enable line (SAen). The output nodes of the bistable element are coupled to differential bit lines (bl and bl#) through a pair of P-channel pass gates (controlled by Ysel) and drive output lines (SAout and SAout#) through respective inverters. However, the need for higher speed, increased memory capacity, and lower power consumption has presented numerous problems for memory devices that use voltage sense amplifiers.

The time for the voltage swing/differential voltage to appear depends on the bit-line capacitance ($C_{BL}$). Hence, the time to develop a certain differential voltage will increase with the increase in capacitance (i.e. number of memory cells in the column). The energy consumption depends on the bit-line resistance ($R_{BL}$). Thus, power requirements of the memory device will increase with the increase in resistance (length of the bit lines). Decreasing memory cell area to integrate more memory on a single chip reduces the current ($I_D$) that is driving the now heavily loaded bit-line. This, in combination with increased capacitance, causes even smaller voltage swings on the bit-line. Lower power consumption requirements have resulted in decreased supply voltages resulting in smaller noise margins. Accordingly, there is a need for sense amplifiers with higher reliability.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
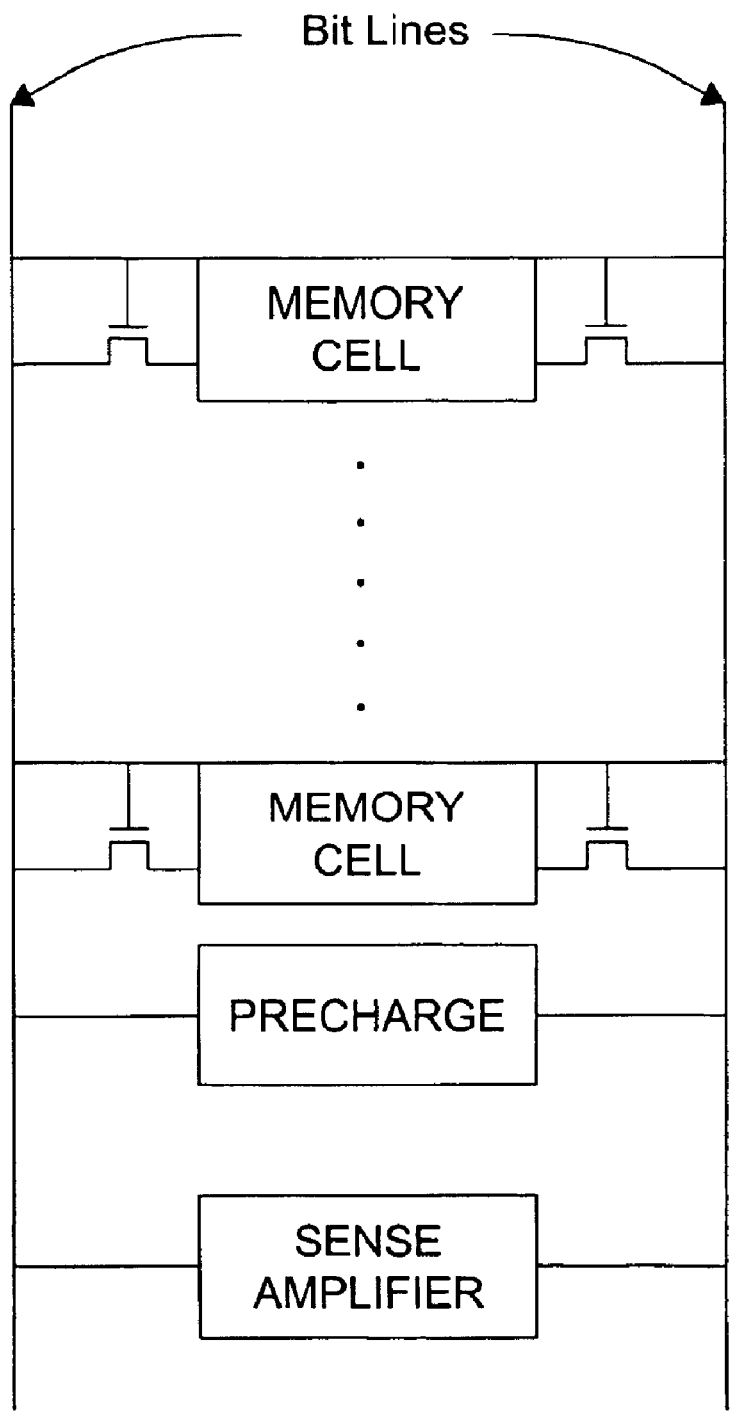
FIG. 1 depicts a semiconductor memory device with a voltage sense amplifier.
Figure 2:
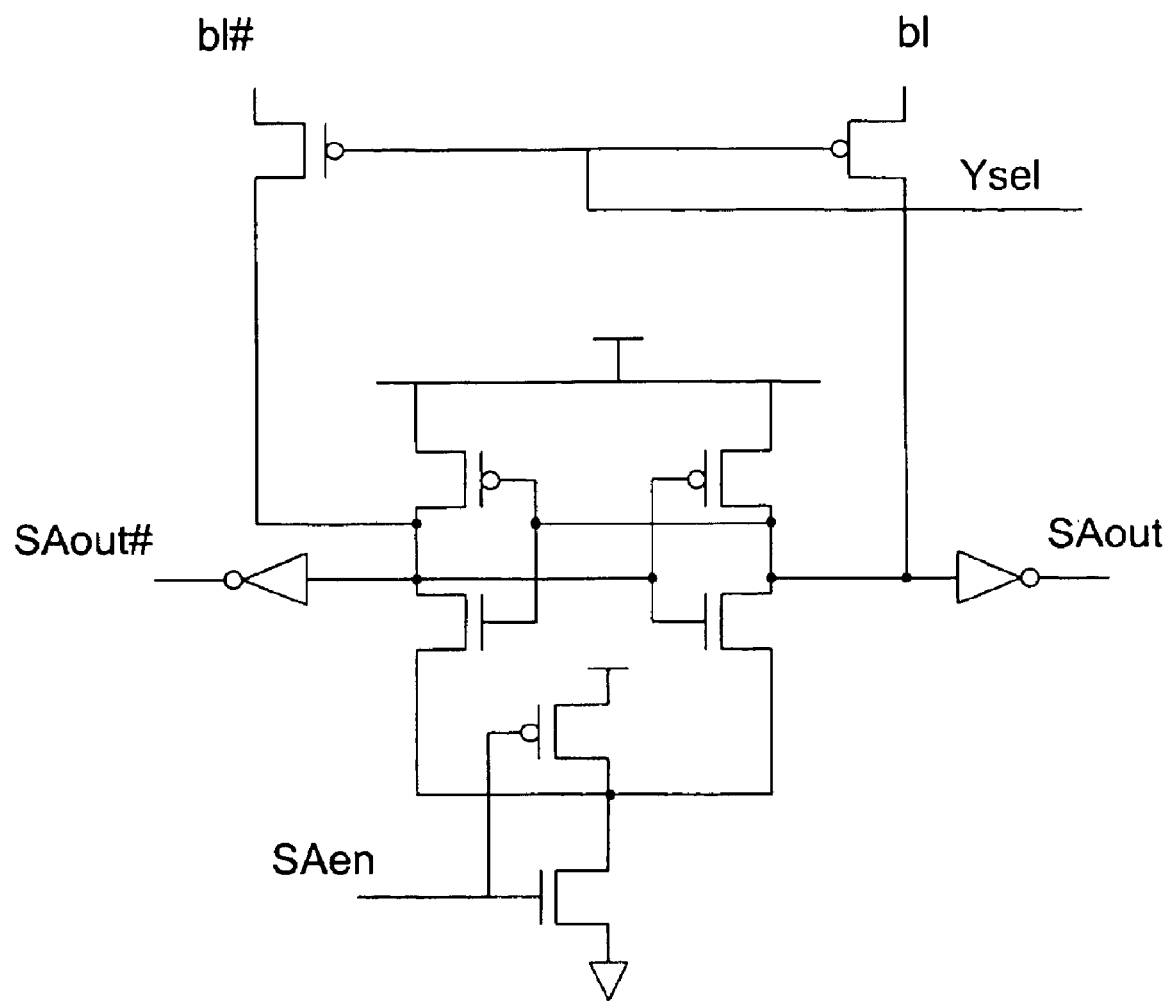
FIG. 2 depicts one example of a voltage sense amplifier.
Figure 3:
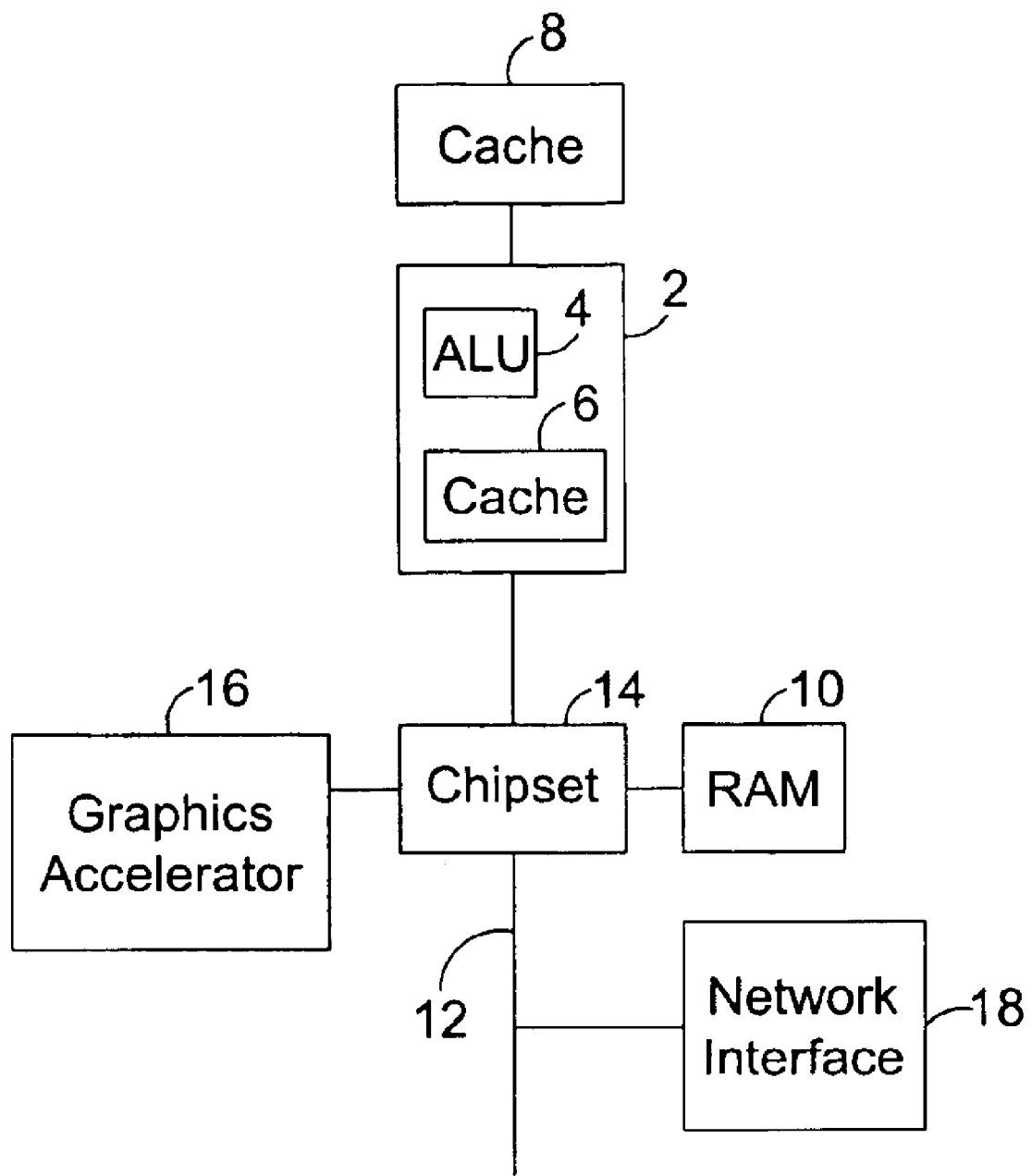
FIG. 3 depicts an example of a computer system.

Some embodiments of the present invention relate to semiconductor memory devices. As stated above, semiconductor memory devices are widely used today in many products and applications such as computer systems. FIG. 3 shows an exemplary illustration of a computer system. The computer system may include a microprocessor die 2, which includes many sub-blocks, such as an arithmetic logic unit (ALU) 4 and on-die cache 6. Microprocessor 2 may also communicate to other levels of cache, such as off-die cache 8. Higher memory hierarchy levels, such as system memory 10, are accessed via host bus 12 and chipset 14. In addition, other off-die functional units, such as graphics accelerator 16 and network interface controller (NIC) 18, to name just a few, may communicate with microprocessor 2 via appropriate busses or ports.

Microprocessor 2 may communicate with memories 6, 8, and 10 to transfer information, store and retrieve data. The conventional method of communicating data is through the representation of logical states in data as binary values (either a one or a zero). One method of such representation is to represent a binary value of one by a high or positive voltage, while a binary value of zero may be represented by a low or negative voltage. In a 1.8 volt complementary metal-oxide semiconductor (CMOS) memory device, for example, a binary value of one may be represented by a high voltage of +1.5 volts (threshold voltage) or greater and a binary value of zero may be represented by a low voltage of +0.3 volts or less. If a voltage above the threshold voltage is detected in the memory device, the device interprets the data represented as a binary value of one.

Figure 4:
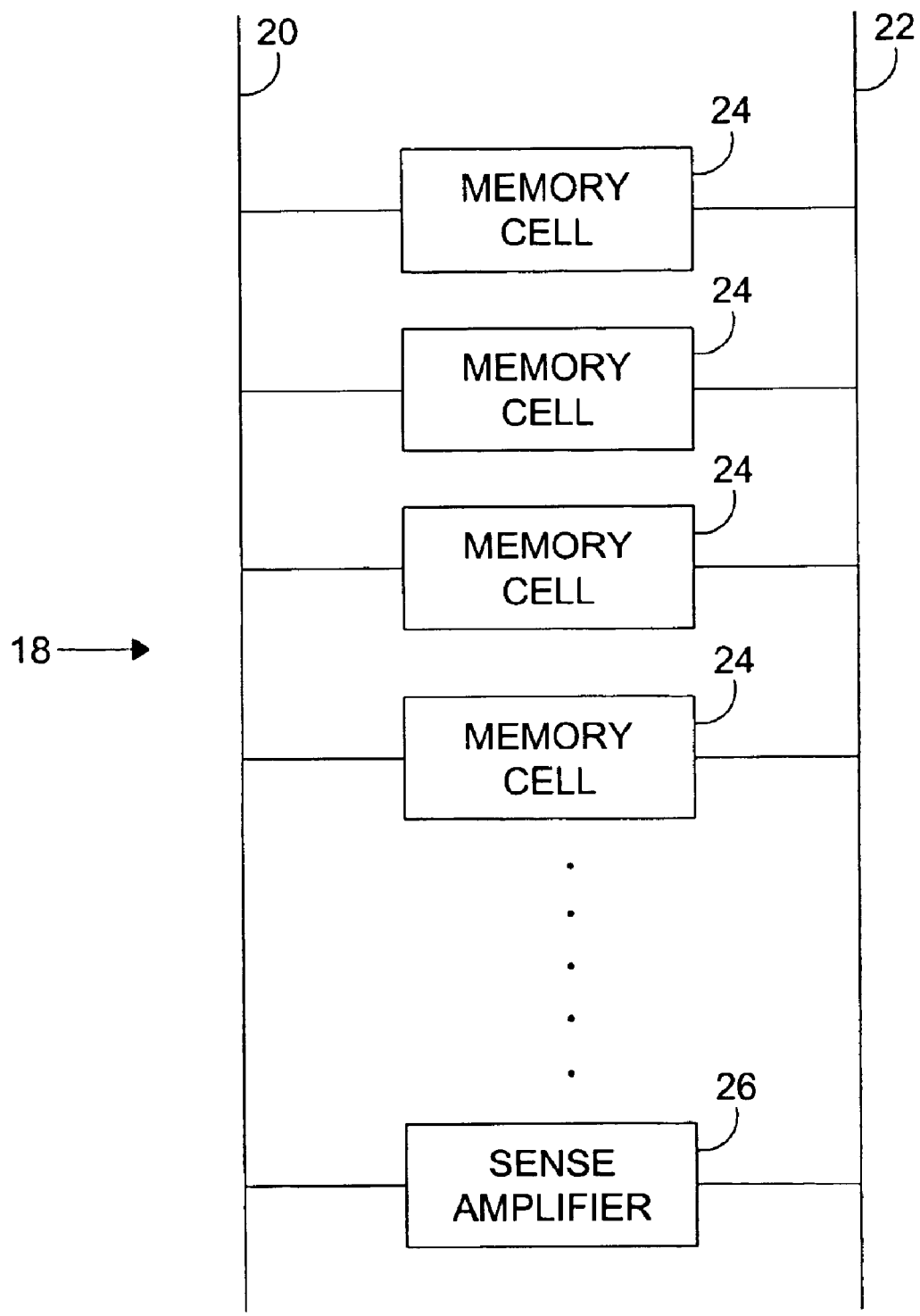
FIG. 4 depicts a semiconductor memory device with a sense amplifier according to one embodiment of the invention.

FIG. 4 shows a simplified diagram of an exemplary semiconductor memory 18. Semiconductor memory 18 may include a pair of bit lines 20 and 22 where bit line 20 carries the true value of the data and bit line 22 carries the complement of the true value of the data. Memory 18 may also include a plurality of memory cells 24 and a sense amplifier 26 coupled to the bit lines 20 and 22. Memory cells 24 store data in binary format that can be accessed through bit lines 20 and 22. The binary data can be stored in memory cells 24 in a variety of ways. When a memory cell 24 is accessed or read, the cell 24 may impress a voltage on the bit lines 20 and 22 that can be sensed or detected by sense amplifier 26. Sense amplifier 26 may also be coupled to multiple bit line pairs similar to the one shown in FIG. 4.

Figure 5:
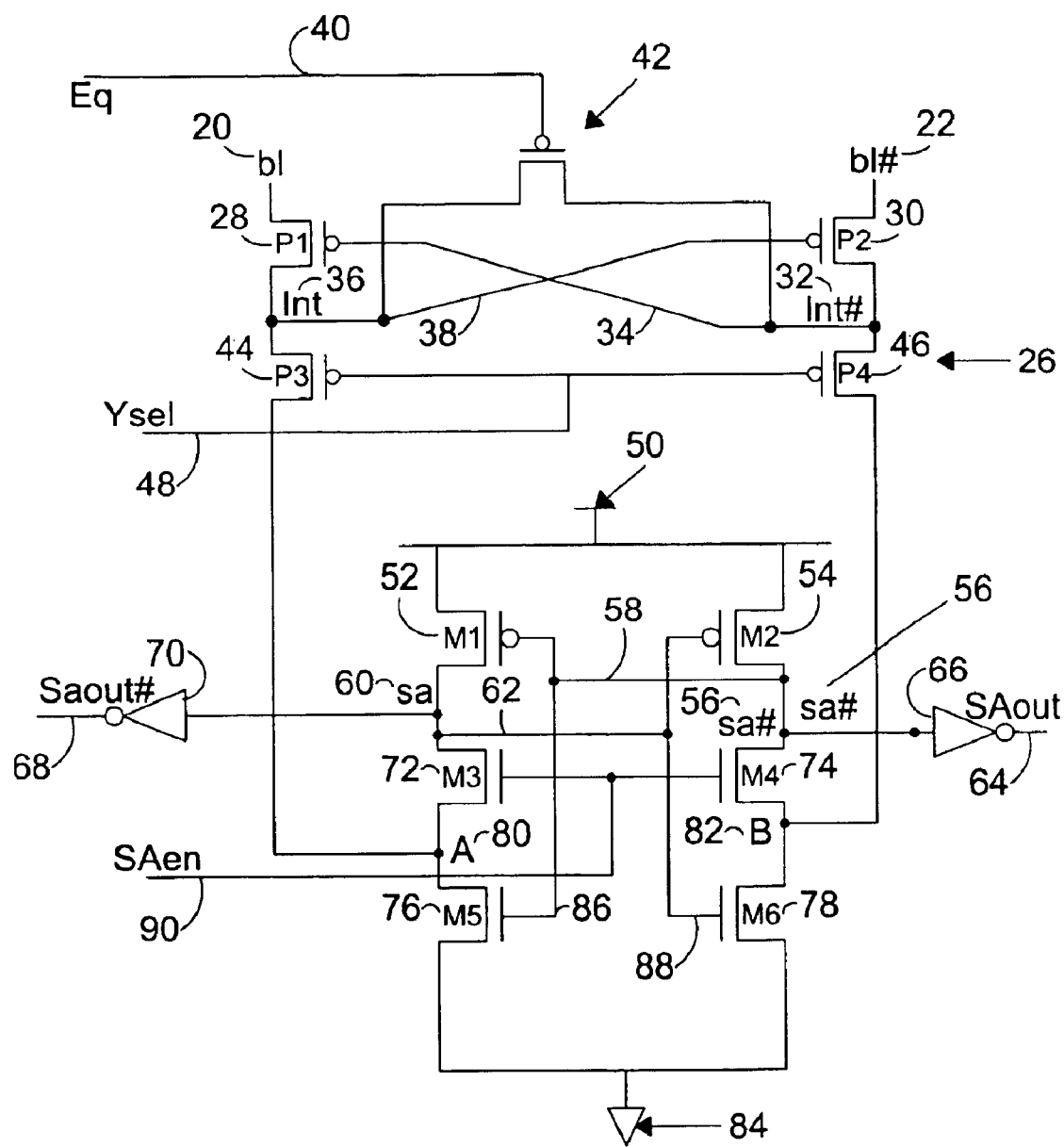
FIG. 5 depicts a sense amplifier according to one embodiment of the invention.

FIG. 5 shows a sense amplifier according to one embodiment of the invention. The sense amplifier 26 may be coupled to bit lines 20 and 22 through a first P-channel metal-oxide semiconductor (PMOS) transistor 28 and a second PMOS transistor 30 respectively. First PMOS transistor 28 may be cross-linked to bit line 22 at a first intermediate node 32 through a first link 34 and second PMOS transistor 30 may be cross-linked to bit line 20 at a second intermediate node 36 through a second link 38.

The sense amplifier 26 may also include an equalize line 40 coupled to an equalize PMOS transistor 42. PMOS transistor 42 is coupled to the links 38 and 34 respectively, which couples the equalize line 40 to the sense amplifier 26.

The sense amplifier 26 may also include a third PMOS transistor 44 and a fourth PMOS transistor 46 coupled to bit lines 20 and 22 at intermediate nodes 36 and 32 respectively. The third and fourth PMOS transistors 44 and 46 may be coupled to a select line 48.

The sense amplifier 26 may also include a supply voltage 50 coupled to a fifth PMOS transistor 52 and a sixth PMOS transistor 54. Fifth PMOS transistor 52 may be cross-linked to a first output node 56 through a third link 58. Sixth PMOS transistor 54 may be cross-linked to a second output node 60 through a fourth link 62. First output node 56 may be coupled to a first output 64 through a first inverter 66. Second output node 60 may be coupled to a second output 68 through a second inverter 70.

Sense amplifier 26 may also include a seventh N-channel metal-oxide semiconductor (NMOS) transistor 72, an eighth NMOS transistor 74, a ninth NMOS transistor 76, and a tenth NMOS transistor 78. Seventh NMOS transistor 72 may be coupled to the second output node 60 and a first input node 80. Eighth NMOS transistor 74 may be coupled to the first output node 56 and a second input node 82. Ninth NMOS transistor 76 may be coupled to the first input node 80 and a ground 84. Tenth NMOS transistor 78 may be coupled to the second input node 82 and the ground 84. Seventh NMOS transistor 72 and eighth NMOS transistor 74 may be coupled to an enable line 90. Ninth NMOS transistor 76 may also be coupled to fifth PMOS transistor 52 and Tenth NMOS transistor 78 may also be coupled to sixth PMOS transistor 54.

FIG. 5 shows the general layout of the various transistors according to one embodiment of the present invention. A more detailed description of one example of the circuit depicted in FIG. 5 will now be described with reference to the source, drain, and gate connection points of the various transistors.

With respect to first transistor 28, the source is connected to bit line 20; the drain is connected to the source of third transistor 44, the gate of second transistor 30, and the source of equalize transistor 42; and the gate is connected to the drain of second transistor 30, the drain of equalize transistor 42, and the source of fourth transistor 46.

With respect to second transistor 30, the source is connected to bit line 22; the drain is connected to the gate of first transistor 28, the drain of equalize transistor 42, and the source of fourth transistor 46; the gate is connected to the drain of first transistor 28, the source of equalize transistor 42, and the source of third transistor 44.

With respect to equalize transistor 42, the source is connected to the drain of first transistor 28, the gate of second transistor 30, and the source of third transistor 44; the drain is connected to the gate of first transistor 28, the drain of second transistor 30, and the source of fourth transistor 46; the gate is connected to the equalize line 40.

With respect to third transistor 44, the source is connected to the drain of first transistor 28, the gate of second transistor 30, and the source of equalize transistor 42; the drain is connected to the drain of seventh transistor 72 and the source of ninth transistor 76; the gate is connected to the gate of fourth transistor 46 and the select line 48.

With respect to the fourth transistor 46, the source is connected to the gate of first transistor 28, the drain of second transistor 30, and the drain of equalize transistor 42; the drain is connected to the drain of eighth transistor 74 and the source of tenth transistor 78; the gate is connected to the gate of third transistor 44 and the select line 48.

With respect to fifth transistor 52, the source is connected to the supply voltage 50 and the source of sixth transistor 54; the drain is connected to the second inverter 70, the drain of the seventh transistor 72, the gate of the sixth transistor 54, and the gate of the tenth transistor 78; the gate is connected to the drain of sixth transistor 54, the first inverter 66, the drain of eighth transistor 74, and the gate of ninth transistor 76.

With respect to sixth transistor 54, the source is connected to the supply voltage 50 and the source of fifth transistor 52; the drain is connected to the gate of fifth transistor 52, the first inverter 66, the drain of the eighth transistor 74, and the gate of the ninth transistor 76; the gate is connected to the drain of fifth transistor 52, the second inverter 70, the drain of seventh transistor 72, and the gate of tenth transistor 78.

With respect to seventh transistor 72, the drain is connected to the drain of fifth transistor 52, the gate of sixth transistor 54, the second inverter 70, and the gate of tenth transistor 78; the source is connected to the drain of third transistor 44 and the drain of ninth transistor 76; the gate is connected to the gate of eighth transistor 74 and the enable line 90.

With respect to eighth transistor 74, the drain is connected to gate of fifth transistor 52, the drain of sixth transistor 54, the first inverter 66, and the gate of ninth transistor 76; the source is connected to the drain of fourth transistor 46 and the drain of tenth transistor 78; and the gate is connected to the gate of seventh transistor 72 and the enable line 90.

With respect to ninth transistor 76, the drain is connected to the drain of third transistor 44 and the source of seventh transistor 72; the source is connected to the source of tenth transistor 78 and ground 84; the gate is connected to the gate of fifth transistor 52, the drain of sixth transistor 54, the first inverter 66, and the drain of eighth transistor 74.

With respect to tenth transistor 78, the source is connected to the drain of fourth transistor 46 and the drain of eighth transistor 74; the drain is connected to the source of ninth transistor 76 and ground 84; the gate is connected to the drain of fifth transistor 52, the gate of sixth transistor 54, the second inverter 70, and the drain of seventh transistor 72.

The sense amplifier according to this embodiment operates in two stages, a pre-charge/discharge phase and an evaluation phase. Prior to operation, the select line and bit lines are held at a high state, which turns off the third and fourth transistors 44 and 46. This isolates that particular bit line pair from the sense amplifier circuit. Also, the enable line is held at a low state, which turns off the seventh and eighth transistors 72 and 74. This isolates the amplifying circuit from the bit line pair.

The first phase is the pre-charge/discharge phase. During the pre-charge/discharge phase, a pre-charge signal is set low and generates an equalize signal and a output signal, which are also set low. The equalize signal is applied to sense amplifier 26 through the equalize line 40 and the output signal is applied to outputs 64 and 68.

By applying a high voltage signal to select line 48, third and fourth PMOS transistors 44 and 46 are turned off isolating the input nodes 80 and 82 and the subsequent portions of the sense amplifier 26 from the bit lines 20 and 22. By applying a high voltage signal to equalize line 40, equalize PMOS transistor 42 is turned off. When equalize PMOS transistor 42 is off, intermediate nodes 32 and 36 are equalized at the same potential and PMOS transistors 28 and 30 are turned on. Turning on PMOS transistors 28 and 30 connects the intermediate nodes 36 and 32 to bit lines 20 and 22 respectively.

During the pre-charge phase, output nodes 56 and 60 are pre-charged to high by setting outputs 64 and 68 low. When outputs 64 and 68 go low, this forces output nodes 56 and 60 to go high. This causes PMOS transistors 52 and 54 to turn off because a high potential is applied to their respective gates through links 58 and 62. At the same time, this causes NMOS transistors 76 and 78 to turn on because a high potential is applied to their respective gates through links 86 and 88. Turning PMOS transistors 52 and 54 off, isolates the sense amplifier 26 from supply voltage 50. Turning NMOS transistors 76 and 78 on, couples input nodes 80 and 82 to ground 84 resulting in a pre-discharge of input nodes 80 and 82.

At the end of this phase, a memory cell 24 is accessed and a current is imposed on bit lines 20 and 22. Since these bit lines 20 and 22 are complements, one of them must be a logical low value. This will result in a discharge of one of the bit lines as it transitions from the artificially imposed high state to a low state indicating the value of the memory cell accessed. As one bit lines discharges and goes to a low state, a voltage differential will be developed between the bit lines.

During the evaluation phase, the select line 48 is grounded and an enable signal is set to high and applied to enable line 90. By grounding select line 48, PMOS transistors 44 and 46 are turned on. This couples the intermediate nodes 32 and 36 to input nodes 80 and 82. By applying a high voltage potential to enable line 90, NMOS transistors 72 and 74 are turned on. When transistors 72 and 74 are turned on, transistors 52, 76 and 54, 78 form cross coupled inverters that will control the voltage level of output nodes 56 and 60. This also couples the input nodes 80 and 82 to output nodes 56 and 60. The equalize signal is set to high, which turns off the equalize transistor 42. This also allows intermediate nodes 32 and 36 to transition to the voltage potentials of the associated bit lines 20 and 22.

PMOS transistors 28, 30, 44 and 46 now act as a current conveyor and convey the current imposed on bit lines 20 and 22 almost instantaneously to input nodes 80 and 82 respectively. By conveying the current almost instantaneously to the sensing portion of sense amplifier 26, this embodiment of the present invention avoids the unnecessary delay seen in voltage sense amplifiers that have to wait for a differential voltage to build up at the input nodes.

In addition, this configuration of transistors creates a low impedance network for the bit line current traveling to the input nodes resulting in a low bit line voltage swing (only a few tens of mV). A low voltage swing translates to low power consumption. The reduced bit line swing is primarily caused by the configuration of PMOS transistors 28, 30, 44 and 46 as a current conveyor with unity gain and configuration of transistors 52, 54, 72, and 76 as a cross-coupled sense amplifier. The PMOS transistors 28, 30, 44, and 46 create a low impedance network from the memory cell 24 to the input nodes 80 and 82. The cross-coupled sense amplifier reduces bit line swing because of the small differential voltage developed due to the differential current. For example, the current at input node 80 (one side of the cross-coupled sense amplifier) will start to rise, which will lead to an increase in the voltage at intermediate node 36. The voltage increase at node 36 will switch off PMOS transistor 30. Once this happens, both the bit lines 20 and 22 will stop discharging through the input nodes 80 and 82 resulting in a low bit line voltage swing.

NMOS transistors 76 and 78 now begin to act as differential current sensors to detect the current differential between input node 80 and input node 82. NMOS transistors 76 and 78 begin sourcing the differential current and translating it into a differential voltage at input nodes 80 and 82.

PMOS transistors 52 and 54 and NMOS transistors 76 and 78, in conjunction with supply voltage 50 and links 86 and 88, now act as a high gain positive feedback amplifier to translate the small differential voltage to a full CMOS level. As soon as one of the bit lines 20 and 22 goes low, it adds current to the drain of transistors 76 or 78 (which are now "on" at the onset of the evaluation phase). This results in some current going through the source and drain of transistor 76 or 78. The bit lines add more current to the transistors 76 and 78 during the evaluation phase. When the current at transistors 76 and 78 changes even slightly, it makes the cross coupled transistors 52 and 54 asymmetric. Because of the cross coupled connections, the asymmetric condition causes the cross coupled circuit to take over and quickly bring the output nodes 56 and 60 to the correct voltages that will indicate the proper logical state of the bit lines 20 and 22 (and thus the logical state of memory cell 24). The amplified voltage is developed at output nodes 56 and 60 and output through inverters 66 and 70 to outputs 64 and 68 where the data can be used by other devices such as a microprocessor.

The above-described embodiments avoid connecting the bit lines directly to the gates of transistors in the sense amplifier 26. This results in a faster differential sensing function in the sense amplifier.

The above-described embodiment also decreases the overall capacitance of the utilized circuit (the total capacitance in the equivalent circuit from memory cell 24 to outputs 64 and 68) by isolating the outputs 64 and 68 from the column MUX capacitance. This will result in faster data detection and transfer from the memory cells to the outputs.

NMOS transistors 76 and 78 also form a cross-coupled inverter that isolates the output nodes 56 and 60 from the input nodes 80 and 82 (and the previous stages of the sense amplifier 26). This reduces the Miller capacitance at the output nodes 56 and 60, which also results in faster data detection and transfer.

Additionally, the speed of the above-described embodiment will be faster because the sense amplifier is fired closer to the output nodes 56 and 60.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A circuit for reading a differential voltage, comprising:

a memory cell;

a first bit line coupled to the memory cell;

a second bit line coupled to the memory cell, the second bit line being complementary to the first bit line;

a pair of equalizer transistors coupled to the first and second bit lines that equalize a pair of intermediate nodes;

an amplifier circuit having a plurality of transistors, the amplifier circuit coupled to the first and second bit lines through one of a source and a drain of at least one of the plurality of transistors; and a pair of pass transistors coupled between the intermediate nodes and the amplifier circuit that couple the amplifier circuit to the first and second bit lines.

2. The circuit of claim 1, wherein the pair of equalizer transistors and the pair of pass transistors comprise a conveyor circuit coupled between the first and the second bit lines and the amplifier circuit.

3. The circuit of claim 1, wherein the amplifier circuit comprises:
a pair of enable transistors coupled to the first and second bit lines at a pair of input nodes that enable the amplifier circuit; and
a pair of cross-coupled inverters coupled between the pair of input nodes and a pair of output nodes, the pair of cross-coupled inverters drive a voltage level of the pair of output nodes to a logical level.

4. The circuit of claim 3, wherein the pair of cross-coupled inverters each comprise a PMOS transistor coupled to an NMOS transistor.

5. The circuit of claim 1, wherein the amplifier circuit further comprises:
a first transistor coupled to the first bit line;
a second transistor coupled to the second bit line;
a third transistor coupled to the first transistor and the second transistor;
a fourth transistor coupled to the first transistor and the second transistor;
a fifth transistor coupled a supply voltage;
a sixth transistor coupled to the supply voltage;
a seventh transistor coupled to the third transistor and the fifth transistor;
an eighth transistor coupled to the fourth transistor, the sixth transistor, and the seventh transistor;
a ninth transistor coupled to a ground, the third transistor, fifth transistor, and the seventh transistor; and
a tenth transistor coupled to the ground, the fourth transistor, the sixth transistor, and the eighth transistor.

6. The circuit of claim 5, further comprising:
a first output coupled to the fifth transistor, the sixth transistor, the seventh transistor, and the eighth transistor; and
a second output coupled to the fifth transistor, the sixth transistor, the seventh transistor, and the eighth transistor.

7. The circuit of claim 6, wherein the first output is coupled to a first inverter and the second output is coupled to a second inverter.

8. The circuit of claim 6, further comprising:
an equalize line;
an equalize transistor coupled to the equalize line, the first transistor, the second transistor, the third transistor, and the fourth transistor;
a select line coupled to the third transistor and the fourth transistor; and
an enable line coupled to the seventh transistor and the eighth transistor.

9. The circuit of claim 8, wherein the first bit line is coupled directly to a source of the seventh transistor and a drain of the ninth transistor, and the second bit line is coupled directly to a source of the eighth transistor and a drain of the tenth transistor.

10. The circuit of claim 8, further comprising:
a third transistor drain;
a ninth transistor drain coupled to the third transistor drain;
a seventh transistor source coupled to the third transistor drain and the ninth transistor drain;
a fourth transistor drain;
a tenth transistor drain coupled to the fourth transistor drain; and
an eighth transistor source coupled to the fourth transistor drain and the tenth transistor drain.

11. The circuit of claim 8, wherein the fifth transistor has a source connected to the supply voltage, a drain connected to the first bit line, and a gate;
the sixth transistor has a source connected to the supply voltage and the fifth transistor source, a drain connected to the second bit line, and a gate;
the seventh transistor has a drain connected to the fifth transistor drain and the sixth transistor gate, a source, and a gate connected to the enable line;
the eighth transistor has a drain connected to the sixth transistor drain and the fifth transistor gate, a source, and a gate connected to the seventh transistor gate;
the ninth transistor has a drain connected to the seventh transistor source, a source connected to the ground, and a gate connected to the fifth transistor gate, sixth transistor drain, and eighth transistor drain; and
the tenth transistor has a drain connected to the eighth transistor source, a source connected to the ground and the ninth transistor source, and a gate connected to the fifth transistor drain, the sixth transistor gate, and the seventh transistor drain.

12. The circuit of claim 11, wherein
the first transistor has a source connected to the first input line, a drain, and a gate;
the second transistor has a source connected to the second input line, a drain connected the first transistor gate, and a gate connected to the first transistor drain;
the third transistor has a source connected to the first transistor drain and the second transistor gate, a drain connected to the seventh transistor drain and the ninth transistor source, and a gate connected to the select line;
the fourth transistor has a source connected to the first transistor gate and the second transistor drain, a drain connected to the eighth transistor drain and the tenth transistor source, and a gate connected to the third transistor gate;
the equalize transistor has a source connected to the first transistor drain, the second transistor gate, and the third transistor source, a drain connected to the first transistor gate, the second transistor drain, and the fourth transistor source, and a gate connected to the equalize line.

13. The circuit of claim 12, wherein
the first inverter is connected to the fifth transistor drain, the sixth transistor gate, the seventh transistor drain and the tenth transistor gate; and
the second inverter is connected to the fifth transistor gate, the sixth transistor drain, the eighth transistor drain, and the ninth transistor gate.

14. The circuit of claim 13, wherein the first, second, third, fourth, fifth, and sixth transistors are PMOS transistors; and
the seventh, eighth, ninth, and tenth transistors are NMOS transistors.

15. The circuit of claim 14, wherein the second input is the complement of the first input.

16. The circuit of claim 15, wherein the second output is the complement of the first output.

17. The circuit of claim 16, wherein the first input and second inputs are bit lines connected to a memory cell.

18. The circuit of claim 1, wherein the amplifier circuit comprises at least eight transistors.

19. The circuit of claim 18, wherein the pair of equalizer transistors comprise a first transistor and a second transistor, the pair of pass transistors comprise a third transistor and a fourth transistor, and the at least eight transistors comprise:
   a fifth transistor coupled a supply voltage;
   a sixth transistor coupled to the supply voltage;
   a seventh transistor coupled to the third transistor and the fifth transistor;
   an eighth transistor coupled to the fourth transistor, the sixth transistor, and the seventh transistor;
   a ninth transistor coupled to a ground, the third transistor, fifth transistor, and the seventh transistor; and
   a tenth transistor coupled to the ground, the fourth transistor, the sixth transistor, and the eighth transistor.

20. The circuit of claim 19, further comprising:
   a first output coupled to the fifth transistor, the sixth transistor, the seventh transistor, and the eighth transistor; and
   a second output coupled to the fifth transistor, the sixth transistor, the seventh transistor, and the eighth transistor.

21. The circuit of claim 20, wherein the first output is coupled to a first inverter and the second output is coupled to a second inverter.

22. A system comprising:
   a die comprising a microprocessor; and
   an off-die cache in communication with the microprocessor;
   wherein the microprocessor comprises:
   a memory cell;
   a first bit line coupled to the memory cell;
   a second bit line coupled to the memory cell, the second bit line being complementary to the first bit line;
   a pair of equalizer transistors coupled to the first and second bit lines that equalize a pair of intermediate nodes;
   an amplifier circuit having a plurality of transistors, the amplifier circuit coupled to the first and second bit lines through one of a source and a drain of at least one of the plurality of transistors; and
   a pair of pass transistors coupled between the intermediate nodes and the amplifier circuit that couple the amplifier circuit to the first and second bit lines.

23. The system as claimed in claim 22, wherein the pair of equalizer transistors and the pair of pass transistors comprise a conveyor circuit coupled between the first and the second bit lines and the amplifier circuit.

24. The system of claim 22, wherein the amplifier circuit comprises:
   a pair of enable transistors coupled to the first and second bit lines at a pair of input nodes that enable the amplifier circuit; and
   a pair of cross-coupled inverters coupled between the pair of input nodes and a pair of output nodes, the pair of cross-coupled inverters drive a voltage level of the pair of output nodes to a logical level.

25. The system of claim 22, wherein the amplifier circuit comprises at least eight transistors.

26. The system of claim 25, wherein the pair of equalizer transistors comprise a first transistor and a second transistor, the pair of pass transistors comprise a third transistor and a fourth transistor, and the at least eight transistors comprise:
   a fifth transistor coupled a supply voltage;
   a sixth transistor coupled to the supply voltage;
   a seventh transistor coupled to the third transistor and the fifth transistor;
   an eighth transistor coupled to the fourth transistor, the sixth transistor, and the seventh transistor;
   a ninth transistor coupled to a ground, the third transistor, fifth transistor, and the seventh transistor; and
   a tenth transistor coupled to the ground, the fourth transistor, the sixth transistor, and the eighth transistor.

27. A circuit comprising:
   a first bit line;
   a second bit line;
   a memory cell coupled between the first bit line and the second bit line;
   a sense amplifier circuit to operate in a pre-charge/discharge phase and an evaluation phase, the sense amplifier circuit including a current conveyor circuit and an amplifier circuit, the current conveyor circuit coupled between the memory cell and the amplifier circuit.

28. The circuit of claim 27, wherein the amplifier circuit comprises:
   a pair of enable transistors coupled to the first and second bit lines at a pair of input nodes that enable the amplifier circuit; and
   a pair of cross-coupled inverters coupled between the pair of input nodes and a pair of output nodes, the pair of cross-coupled inverters drive a voltage level of the pair of output nodes to a logical level.

29. The circuit of claim 27, wherein the conveyor circuit comprises:
   a pair of equalizer transistors coupled to the first and second bit lines that equalize a pair of intermediate nodes; and
   a pair of pass transistors coupled between the intermediate nodes and the amplifier circuit that couple the amplifier circuit to the first and second bit lines.

30. The circuit of claim 29, wherein the amplifier circuit comprises at least eight transistors.

31. The circuit of claim 30, wherein the pair of equalizer transistors comprise a first transistor and a second transistor, the pair of pass transistors comprise a third transistor and a fourth transistor, and the at least eight transistors comprise:
   a fifth transistor coupled a supply voltage;
   a sixth transistor coupled to the supply voltage;
   a seventh transistor coupled to the third transistor and the fifth transistor;
   an eighth transistor coupled to the fourth transistor, the sixth transistor, and the seventh transistor;
   a ninth transistor coupled to a ground, the third transistor, fifth transistor, and the seventh transistor; and
   a tenth transistor coupled to the ground, the fourth transistor, the sixth transistor, and the eighth transistor.

* * * * *